United States Patent
Fujii et al.

(10) Patent No.: US 6,933,489 B2
(45) Date of Patent: Aug. 23, 2005

(54) BACK ILLUMINATED PHOTODIODE ARRAY AND METHOD OF MANUFACTURING THE SAME

(75) Inventors: Yoshimaro Fujii, Hamamatsu (JP); Kouji Okamoto, Hamamatsu (JP); Akira Sakamoto, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 242 days.

(21) Appl. No.: 10/434,194

(22) Filed: May 9, 2003

(65) Prior Publication Data

US 2003/0209652 A1 Nov. 13, 2003

Related U.S. Application Data

(60) Provisional application No. 60/430,673, filed on Dec. 4, 2002.

(30) Foreign Application Priority Data

May 10, 2002 (JP) .................................. P2002-136206

(51) Int. Cl.[7] ............................................. H01L 31/00
(52) U.S. Cl. .................................... 250/214.1; 257/460
(58) Field of Search .................... 250/208.2, 214 R, 250/214.1; 257/414, 460, 431–434, 477

(56) References Cited

U.S. PATENT DOCUMENTS 4,975,755 A * 12/1990 Nishizawa .................. 257/114
6,426,991 B1    7/2002 Mattson et al. ............... 378/19
2003/0218120 A1 * 11/2003 Shibayama .............. 250/214.1

FOREIGN PATENT DOCUMENTS

| JP | 1-205465 | 8/1989 |
| JP | 4-286160 | 10/1992 |
| JP | 2001-291853 | 10/2001 |
| JP | 2001-339057 | 12/2001 |

* cited by examiner

*Primary Examiner*—David Porta
*Assistant Examiner*—Patrick J. Lee
(74) *Attorney, Agent, or Firm*—Drinker Biddle & Reath LLP

(57) ABSTRACT

Disclosed are a back illuminated photodiode array, which is mass-producible and has an ultra-thin high-performance single-sided electrode structure, and a method of manufacturing the same. Both electrodes of a photodiode on a semiconductor substrate 1, which are anode and cathode, are collected on one plane of the substrate. The collection of the electrodes is achieved by electrically introducing one of them to the other plane via a hole H penetrating the semiconductor substrate 1. The semiconductor substrate 1 is thinned by polishing, and thus the time for forming the hole H is shortened. Moreover, during the manufacturing process, a supporting plate 3 is attached to the semiconductor substrate for reinforcing the thinned substrate. Thus, handling of a wafer during the process becomes easy and complies with mass production.

2 Claims, 2 Drawing Sheets

BACK ILLUMINATED PHOTODIODE ARRAY AND METHOD OF MANUFACTURING THE SAME

CROSS-REFERENCE TO RELATED APPLICATION

This application claims priority to Provisional Application Ser. No. 60/430673 filed on Dec. 4, 2002, which is/are hereby incorporated by reference in its/their entirety.

BACKGROUND OF THE INVENTION

1. Field of the Invention

The present invention relates to a back illuminated photodiode array and a method of manufacturing the same.

2. Related Background Art

Three-dimensional packaging technologies have been studied in many fields. Conventionally, in a three-dimensional packaging, a hole penetrating upper and lower planes of a substrate is formed, and an electrode at one plane side is drawn out through this hole to the other plane side.

In such a through-hole formation process in the three-dimensional packaging, ICP plasma etching is usually used. However, the thickness of a wafer is as thick as about 300 $\mu$m to 400 $\mu$m, and thus a considerable amount of time is required to form a through-hole. Moreover, an etching process by use of an ICP plasma etching apparatus is performed once per wafer, and thus multiple pieces of wafers cannot be processed simultaneously. As a result, it requires a large amount of time to form a through-hole for one piece of wafer. Therefore, by use of this etching technology, a product that can be formed only by small quantities at one time of etching, in other words, a large area photodiode array cannot be industrially mass-produced. For example, formation of several large area photodiode arrays by taking several hours per wafer to form the hole is not approved commercially.

SUMMARY OF THE INVENTION

The present invention was made in consideration of the above problems. An object of the present invention is to provide a mass-producible back illuminated photodiode array and a method of manufacturing the same.

To solve the problems described above, a method of manufacturing a back illuminated photodiode array, according to the present invention, is characterized in comprising the steps of: (a) forming high concentration impurity regions on one plane side of a semiconductor substrate; (b) attaching a supporting plate to the one plane side of the semiconductor substrate; (c) thinning the semiconductor substrate by polishing the other plane side of the semiconductor substrate; (d) forming high concentration impurity regions and a plurality of photodiodes on the other plane side of the semiconductor substrate; (e) forming holes reaching the high concentration impurity regions on the one plane side of the semiconductor substrate from the high concentration impurity regions on the other plane side thereof; (f) electrically connecting the high concentration impurity regions on the one plane side and the other plane side to each other via the holes; and (g) removing the supporting plate after the step (f). One of an anode and a cathode of the photodiode is positioned on the one plane side of the semiconductor substrate, and the other is positioned on the other plane side.

According to the above-described method, the photodiode array is thinned by the polishing step, and thus the time required for forming the hole is shortened. Moreover, the high concentration impurity regions formed at the both plane sides of the semiconductor substrate are connected via this hole, and thus the anode and cathode of the photodiode can be electrically introduced to the same plane (the other plane) side of the semiconductor substrate. As to problems related to a lowered substrate strength due to the thinning thereof and further related to a wafer breakage, the supporting plate is provided on the one plane side of the semiconductor substrate in manufacturing the wafer, thus enabling reinforcement of the wafer. According to the present invention, the photodiode array including the plurality of photodiodes comes to be industrially mass-producible for the first time. Furthermore, this photodiode array is a back illuminated, and thus can be used in a photodetector with a high signal-to-noise ratio and high precision, Moreover, a constitution as below can be made. Specifically, the semiconductor substrate and the high concentration impurity regions are a first conductivity type (i.e., n-type), and the plurality of photodiodes include a plurality of impurity regions of a second conductivity type (i.e., p-type) and a semiconductor substrate. The anode and cathode positioned at the one plane side of any of the photodiodes are electrically introduced to the other plane side.

Moreover, when the manufacturing method includes a step of forming an overall impurity diffusion layer of a first conductivity type, which is shallower than the high concentration impurity regions, on an overall plane of the one plane side of the semiconductor substrate, this overall impurity diffusion layer functions as an accumulation layer.

Moreover, in the case of including a step of forming an oxide film on the one plane side of the semiconductor substrate, this oxide film can be allowed to function as a protection film.

Moreover, the method of manufacturing a back illuminated photodiode array according to the present invention further includes a step of burying resin in the hole. By burying the resin in the hole, the strength of the semiconductor substrate can be improved.

It is preferable that the resin buried in the holes has photosensitivity, and the method further comprises the steps of: applying photoresist which will become this resin onto the entire plane of the other plane side of the semiconductor substrate, removing only the photoresist in regions where electrodes are to be formed on the other plane side of the semiconductor substrate; and forming the electrodes in the regions where the photoresist is removed.

In this case, the resin can be buried by a normal photolithography process using a photoresist and disclosing of the electrode can be performed by use of the photoresist.

Furthermore, from the viewpoint of the three dimensional packaging, it is preferable that the above-described method of manufacturing a back illuminated photodiode array further includes a step of attaching the other plane side of the semiconductor substrate to a circuit board with bumps interposed therebetween so as to electrically connect anodes and cathodes of the photodiodes to the circuit board. In this case, connection wirings of the anodes and cathodes of the photodiodes, which are electrically connected to the circuit board by the bumps, can be extended in a direction of the circuit board, namely, a thickness direction of the semiconductor substrate. Thus, a packaging area can be reduced. Specifically, a dead space is reduced in a plane direction, and thus a plurality of back illuminated photodiode arrays can be arranged in a lateral direction of the semiconductor substrate (two-dimensionally). Accordingly, as a whole, an image scanner with a much larger area can be provided.

Note that such a large-area back illuminated photodiode array is applicable for a computerized tomography (CT) scanner and a positron-emission tomography (PET) scanner by combination thereof with a scintillator that converts X-rays and γ-rays into visible light.

Moreover, the back illuminated photodiode array of the present invention has characteristics as below. Specifically, the back illuminated photodiode array can be manufactured by the above-described method, and the high concentration impurity regions are formed on the both plane sides of the semiconductor substrate. In the respective back illuminated photodiode arrays selectively connected to the anodes and cathodes of the photodiodes formed on the other plane side of the semiconductor substrate, the high concentration impurity regions are electrically connected to each other via the holes penetrating the semiconductor substrate in the thickness direction thereof, and the resin is buried in the holes.

The above-described back illuminated photodiode array has advantages in terms of the three dimensional packaging and the manufacturing method, and in addition, the resin inside the holes can suppress lowering of the substrate strength of the back illuminated photodiodes.

Moreover, it is preferable that the semiconductor substrate and the high concentration impurity regions are a first conductivity type, photodiodes formed on the other plane side of the semiconductor substrate include an impurity region of a second conductivity type, and a semiconductor substrate and an overall impurity diffusion layer of the first conductivity type, which is shallower than the high concentration impurity regions, is provided on an overall plane of the one plane side of the semiconductor substrate.

In this case, the overall impurity diffusion layer can be allowed to function as an accumulation layer, and thus a high-performance detection can be performed.

DESCRIPTION OF THE PREFERRED EMBODIMENTS

Figure 1A:
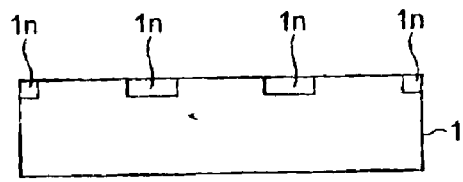
FIG. 1A is an explanatory view for illustrating a method of manufacturing the back illuminated photodiode array according to the embodiment and shows a constitution of a longitudinal cross section of the back illuminated photodiode array.

Hereinafter, a description will be given for a back illuminated photodiode array according to an embodiment. Note that the same components are denoted by the same reference numerals and a repetitive description will be omitted.

FIG. 1A to FIG. 1J is an explanatory view for illustrating a method of manufacturing the back illuminated photodiode array according to the embodiment and shows a constitution of a longitudinal cross section of the back illuminated photodiode array. A detailed description thereof will be given below.

In this manufacturing method, the following steps (1) to (10) are sequentially executed.

Step (1)

First, a semiconductor substrate (wafer) 1 made of Si is prepared. A conduction type of the semiconductor substrate 1 is a n-type, and the specific resistance thereof is about 1 kΩ·cm. The specific resistance of the semiconductor substrate 1 is set in consideration of a balance among a low capacity, a low noise, and a high-speed response. Next, on a rear plane side (one plane side) of the semiconductor substrate 1, a plurality of n-type high concentration impurity regions 1n with a thickness of several μm are formed at predetermined intervals therebetween (FIG. 1A). Herein, it should be noted that the term "rear plane" means a light incident plane of a back illuminated photodiode to be ultimately manufactured and is a stipulated term used for the sake of convenience in explanation. Thus, the "rear plane" is not the lower-side plane in the drawing. Moreover, it is assumed that the high concentration impurity region 1n is the n-type and is formed by diffusion of phosphorous and that the high concentration means a region having a carrier concentration of at least $1 \times 10^{17}$ cm$^{-3}$ or more.

Step (2)

Figure 1B:
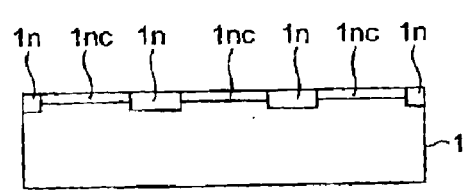
FIG. 1B is an explanatory view for illustrating a method of manufacturing the back illuminated photodiode array according to the embodiment and shows a constitution of a longitudinal cross section of the back illuminated photodiode array.

Next, a thin overall impurity semiconductor layer 1nc is formed on an overall plane of the same rear plane side of the semiconductor substrate 1 (FIG. 1B). A conduction type of the overall impurity semiconductor layer 1nc is the n-type, and an impurity concentration thereof is high. Note that the impurities used in this formation step are arsenic, and a projection range of ion implantation thereof is set to be smaller than the diffusion depth of phosphorous. Thus, a depth of the layer is shallow (0.1 μm or less). A method of forming this layer is ion implantation, and it is assumed, for example, that an injection energy is 80 kev and a dose is $2 \times 10^{15}$ cm$^{-2}$. The depth of this layer is shallow, and thus a high sensitivity is achieved as performance of a photodetector.

Step (3)

Figure 1C:
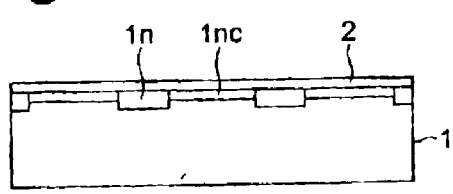
FIG. 1C is an explanatory view for illustrating a method of manufacturing the back illuminated photodiode array according to the embodiment and shows a constitution of a longitudinal cross section of the back illuminated photodiode array.

Next, an oxide film 2 is formed by thermal oxidation on the rear plane side of the semiconductor substrate 1 (FIG. 1C).

Step (4)

Figure 1D:
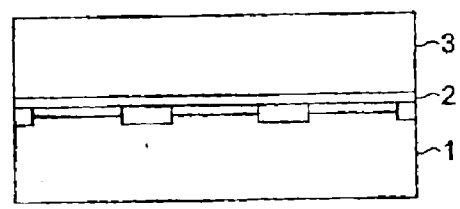
FIG. 1D is an explanatory view for illustrating a method of manufacturing the back illuminated photodiode array according to the embodiment and shows a constitution of a longitudinal cross section of the back illuminated photodiode array.

Furthermore, a supporting plate 3 is attached to the rear plane side of the semiconductor substrate 1 (FIG. 1D). A material of this supporting plate 3 is removed in a later step as described later. Thus, the material does not need to be a special one and, for example, a p-type silicon of about several 10Ω·cm, which is generally easy to be procured, is used. In the attachment step, the supporting plate 3 is pressed against the semiconductor substrate 1 with the oxide film 2 interposed therebetween, and the attachment is performed by applying heat of 1000° C. or less thereto.

Step (5)

Figure 1E:
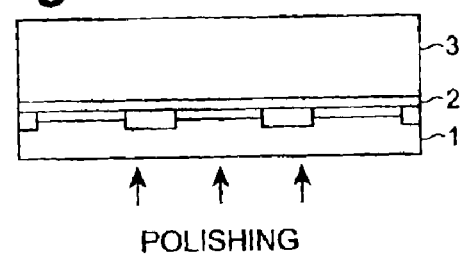
FIG. 1E is an explanatory view for illustrating a method of manufacturing the back illuminated photodiode array according to the embodiment and shows a constitution of a longitudinal cross section of the back illuminated photodiode array.

Thereafter, the semiconductor substrate 1 is polished from the front plane side (the plane opposite to the rear plane: the other plane) and is thinned to have a predetermined thickness (FIG. 1E). After this mirror polishing step, the thickness of the semiconductor substrate 1 is, for example, some 10 μm to 150 μm, preferably about 50 μm to 100 μm.

Step (6)

Figure 1F:
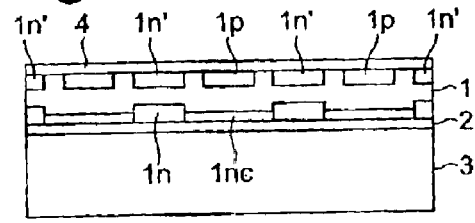
FIG. 1F is an explanatory view for illustrating a method of manufacturing the back illuminated photodiode array according to the embodiment and shows a constitution of a longitudinal cross section of the back illuminated photodiode array.

Next, on the front plane side of the semiconductor substrate 1, a plurality of n-type high concentration impurity regions 1n' and a plurality of p-type impurity regions 1p are formed at predetermined intervals. Furthermore, an oxide film (SiO$_2$) 4 is formed by thermal oxidation on the front plane side of the semiconductor substrate 1 (FIG. 1F). The n-type high concentration impurity regions 1n' are formed by diffusion of phosphorous. Moreover, the p-type impurity regions 1p are formed by diffusion or ion implantation of boron in the substrate. The p-type impurity regions 1p is included in a PN junction with the n-type semiconductor substrate 1, thus constituting photodiodes. These photodiodes are positioned at the front plane side of the semiconductor substrate 1. Moreover, these photodiodes can be avalanche photodiodes or PIN photodiodes.

Step (7)

Figure 1G:
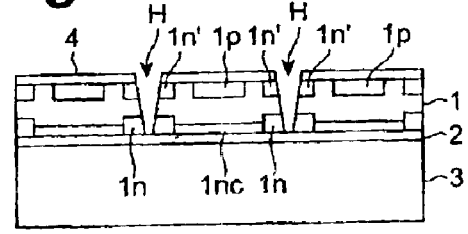
FIG. 1G is an explanatory view for illustrating a method of manufacturing the back illuminated photodiode array according to the embodiment and shows a constitution of a longitudinal cross section of the back illuminated photodiode array.

Next, holes H reaching the rear plane side of the semiconductor substrate 1 from the front plane side thereof are formed (FIG. 1G). These holes H are formed by forming a mask on the oxide film 4 at the front plane side of the semiconductor substrate 1, the mask having openings on the high concentration impurity regions 1n' and by etching the plane of the semiconductor substrate 1 via the mask. In the etching, so as to set the oxide film 4 to be the mask, patterning can be also performed for the oxide film 4 by photolithography. For this etching, isotropic wet etching can be used and isotropic dry etching such as atmospheric downstream plasma (ADP) and the like can be also used. For an etching solution in the wet etching, HF/NHO$_3$, and the like can be used.

By use of the etching method as described above, etching with relatively high productivity is possible, and the holes H become cone-shaped holes, namely, tapered holes. Thus, step coverage in electrode formation at a subsequent stage is improved. As to the holes H, exposed planes of the high concentration impurity regions 1n' at the front plane side of the semiconductor substrate 1, exposed planes of the high concentration impurity regions in at the rear plane side thereof, and etched planes of the semiconductor substrate 1 are included in inner planes of the holes H.

Step (8)

Figure 1H:
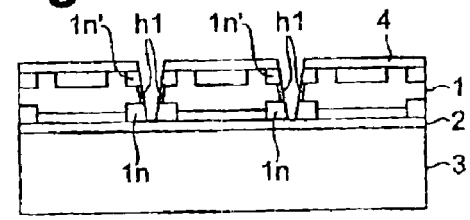
FIG. 1H is an explanatory view for illustrating a method of manufacturing the back illuminated photodiode array according to the embodiment and shows a constitution of a longitudinal cross section of the back illuminated photodiode array.

Furthermore, n-type impurities are added into the semiconductor substrate 1 from sides of the holes H, and the n-type high concentration impurity regions 1n' at the front plane side and the n-type high concentration impurity regions 1n at the rear plane side are electrically connected to each other (FIG. 1H). This impurity-added region is denoted by reference numeral h1. This impurity addition step can be executed by performing ion implantation or diffusion of the n-type impurities from the front plane side of the semiconductor substrate 1 as the foregoing mask is left as it is or by use of the oxide film 4 as a mask.

Step (9)

Next, in order to reduce series resistance, metal electrode films h2 made of aluminum are formed on the inner planes of the holes H. These metal electrode films form cathode common electrodes and are extended to the front plane of the semiconductor substrate 1. If the oxide film 4 is patterned so as to expose the surfaces of the p-type impurity regions 1p of the semiconductor substrate 1 before the formation of the metal electrode films h2, contacts of the p-type impurity regions 1p can be formed simultaneously with the metal electrode films h2. Thereafter, photosensitive resin (photoresist such as polyimide and the like) R is applied onto the front plane of the semiconductor substrate 1 so as to fill the inside of the holes H therewith, thus exposing metal electrodes made of aluminum, by a photolithography process. Furthermore, these exposed metal electrode portions are sequentially coated with Ni and Au, thus forming electrodes OM in a photodiode array.

Lastly, the supporting plate 3 is completely removed by grinding and dry etching, thus exposing the oxide film 2.

Figure 1I:
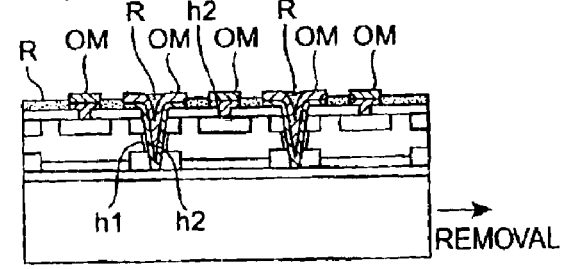
FIG. 1I is an explanatory view for illustrating a method of manufacturing the back illuminated photodiode array according to the embodiment and shows a constitution of a longitudinal cross section of the back illuminated photodiode array.

Next, by cutting out the wafer into chips with a predetermined chip size by dicing, a back illuminated photodiode array having the electrode only on the front plane side (the other plane side) of the semiconductor substrate is completed (FIG. 1I).

Step (10)

Figure 1J:
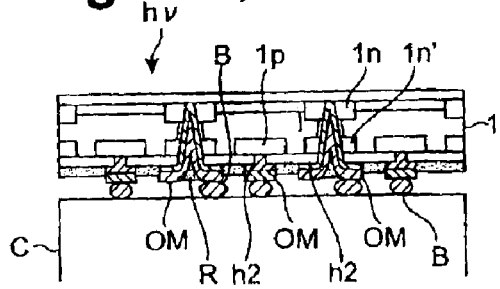
FIG. 1J is an explanatory view for illustrating a method of manufacturing the back illuminated photodiode array according to the embodiment and shows a constitution of a longitudinal cross section of the back illuminated photodiode array.

This photodiode array chip is reversed upside down, in other words, the front plane side of the semiconductor substrate 1 is positioned to face a circuit board C and disposed so as to set the light incident plane to be the rear plane. Specifically, the semiconductor substrate 1 is disposed on the circuit board C with bumps B interposed therebetween, the bumps being made of Au, solder or the like, and the electrodes OM of the foregoing photodiodes are electrically connected to wirings on the circuit board C by the bumps B (FIG. 1J). Cathodes of the photodiodes, namely, the n-type semiconductor substrate 1 and the n-type high concentration impurity regions in are connected to the electrodes OM positioned on the front plane side of the semiconductor substrate 1 via the metal electrode films h2 and the impurity-added regions h1. Moreover, anodes of the photodiodes, namely, the p-type impurity regions 1p are connected to the metal electrode films h2 and the electrodes OM. These electrodes are connected, respectively, to wirings for cathodes and anodes of the circuit board C via the bumps B.

As described above, the method of manufacturing a back illuminated photodiode array includes the steps of: (a)

forming the high concentration impurity regions 1n on the one plane side (the rear plane) of the semiconductor substrate 1; (b) attaching the supporting plate 3 to the rear plane side of the semiconductor substrate 1; (c) thinning the semiconductor substrate 1 by polishing the other plane side (the front plane side) of the semiconductor substrate 1; (d) forming the high concentration impurity regions 1n' and the plurality of photodiodes on the front plane side of the semiconductor substrate 1; (e) forming the holes H reaching the high concentration impurity regions in on the rear plane side of the semiconductor substrate 1 from the high concentration impurity regions 1n' on the front plane side thereof; (f) electrically connecting the high concentration impurity regions 1n and 1n' on the rear place side and front plane side to each other via the holes H; and (g) removing the supporting plate 3 after the step (f). Any one of the anode and cathode of the photodiode is positioned at any one of the one plane side and the other plane side of the semiconductor substrate and, the other thereof is positioned at the remaining plane side.

According to the above-described manufacturing method, the photodiode array, namely, the semiconductor substrate 1 is thinned to have a predetermined thickness by the polishing step. Thus, the time for forming the holes H is shortened. In addition, via these holes H, the high concentration impurity regions 1n and 1n', which are formed on the both plane sides of the semiconductor substrate 1, are connected to each other Thus, the anodes and cathodes of the photodiodes can be electrically introduced to the same plane side (the front plane side) of the semiconductor substrate 1. The strength of the substrate is lowered by the thinning thereof. However, since the supporting plate is provided on the rear plane side of the semiconductor substrate 1, the substrate can be reinforced during the steps of preprocess. With this constitution, the photodiode array including the plurality of photodiodes comes to be industrially mass-producible for the first time.

Furthermore, this photodiode array is a back illuminated, and thus can be used for a detection apparatus with a high signal-to-noise ratio and high precision.

Moreover, the above-described method of manufacturing a back illuminated photodiode array further includes a step of burying the resin R in the holes H. By burying the resin in the holes H, the strength of the semiconductor substrate 1 can be improved.

Moreover, this resin buried in the holes H has photosensitivity. The above-described manufacturing method further includes the steps of: applying photoresist which will become this resin onto the entire plane of the other plane side (the front plane) of the semiconductor substrate 1; removing only the photoresist in regions where the electrodes (h2 and OM) are to be formed on the other plane side of the semiconductor substrate 1; and forming the electrodes h2 in the regions where the photoresist is removed. Thus, the resin R can be buried by a normal photolithography process using photoresist and disclosing of the electrodes can be contacted by use of an oxide film patterned by use of photoresist before making the electrodes.

Moreover, the semiconductor substrate 1 and the high concentration impurity regions 1n and 1n' are the first conductivity type (the n-type in the above description). The plurality of photodiodes include the plurality of impurity regions 1p of the second conductivity type (the p-type in the above description) and the semiconductor substrate 1. The anode and cathode, which are positioned at the one plane side (the rear plane) of any one of the photodiodes, are electrically introduced to the other plane side (the front plane).

Moreover, the above-described manufacturing method includes the step of forming the overall impurity semiconductor layer 1nc of the first conductivity type (the n-type in the above description), which is shallower than the high concentration impurity regions, on the overall plane of the one plane side of the semiconductor substrate 1. Thus, this overall impurity semiconductor layer 1nc can be allowed to function as an accumulation layer.

Moreover, the above-described manufacturing method includes the step of forming the oxide film 2 on the one plane side (the rear plane) of the semiconductor substrate 1. Thus, this oxide film can be allowed to function as a protection film.

Furthermore, from the viewpoint of the three dimensional packaging, the above-described method of manufacturing a back illuminated photodiode array includes the step of attaching the front plane side of the semiconductor substrate 1 to the circuit board C with the bumps B interposed therebetween so as to electrically connect the anodes and cathodes of the photodiodes to the circuit board C. In this case, connection wirings of the anodes and cathodes of the photodiodes, which are electrically connected to the circuit board C by the bumps B, can be extended in a direction of the circuit board, namely, a thickness direction of the semiconductor substrate 1. Thus, a packaging area can be reduced.

Moreover, in the above-described back illuminated photodiode array, the high concentration impurity regions 1n and 1n' are formed on the rear plane side and front plane side of the semiconductor substrate 1, and are selectively connected to the anodes and cathodes of the photodiodes in which the PN junction is formed on the front plane side of the semiconductor substrate 1. In the above-described back illuminated photodiode array, the high concentration impurity regions 1n and 1n' are electrically connected to each other via the holes H penetrating the semiconductor substrate 1 in thickness direction thereof, and the resin R is filled inside the holes H.

This back illuminated photodiode array has advantages in terms of the three dimensional packaging and the manufacturing method, and in addition, the resin inside the holes can suppress lowering of the substrate strength of the back illuminated photodiodes.

Moreover, according to the structure of the foregoing back illuminated photodiode array, the semiconductor substrate 1 and the high concentration impurity regions 1n and 1n' are the first conductivity type (the n-type in the above description), the photodiodes formed on the other plane side of the semiconductor substrate 1 include the impurity regions 1p of the second conductivity type (the p-type in the above description), and the semiconductor substrate 1 and the overall impurity semiconductor layer 1nc of the first conductivity type, which is shallower than the high concentration impurity regions 1n, is formed on the overall plane of the one plane side of the semiconductor substrate 1. Thus, the overall impurity semiconductor layer 1nc can be allowed to function as an accumulation layer and a high-performance detection can be performed.

Figure 2:
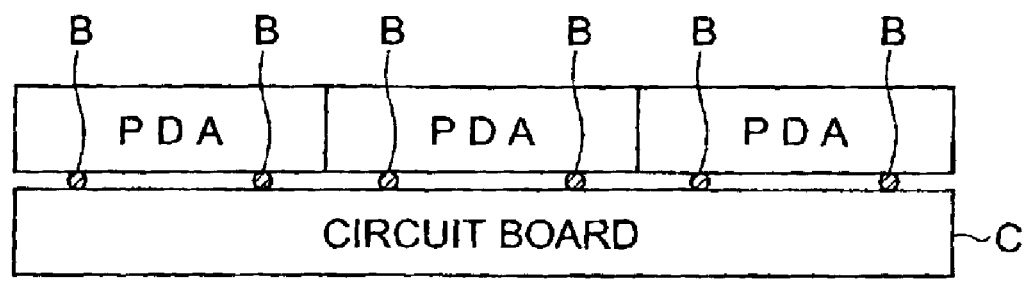
FIG. 2 is an explanatory view of an image scanner including a plurality of the back illuminated photodiode arrays PDA shown in FIG. 1J on a circuit board C.

FIG. 2 is an explanatory view of an image scanner including a plurality of the back illuminated photodiode arrays PDA shown in FIG. 1J on the circuit board C. According to the above-described constitution, the three dimensional packaging is made possible, and thus the plurality of back illuminated photodiode arrays PDA having less dead space in a plane direction can be arranged two-dimensionally without gaps therebetween. Specifically, as a whole, an image scanner with a much larger area can be provided.

Note that such a large-area back illuminated photodiode array is applicable for a computerized transverse axial tomography (CT) scanner and, to be more specific, for a panel-shaped CT scanner using multiple X-rays, and a positron-emission tomography (PET) scanner. In the case of these scanners, a scintillator (BGO, CSO, CWO, and the like), which is two-dimensionally divided, is provided on a light incident plane.

Note that, in the above-described polishing step, chemical polishing can be used other than mechanical polishing, and the exposed plane of the semiconductor substrate 1 can be subjected to mirror polishing process. Moreover, the overall impurity semiconductor layer 1nc on the rear plane side functions as an accumulation layer. The accumulation layer can have ground potential. However, a positive potential can be also given thereto so that reverse bias is applied.

Moreover, in the above-described back illuminated photodiode array, the overall impurity semiconductor layer to be the accumulation layer can be formed to be thin, thus enabling improvement in sensitivity to ultraviolet rays.

Moreover, in the step before the removal of the supporting plate 3, dicing is performed by attaching a dicing tape to the semiconductor substrate 1 after the electrode OM formation, retrieval of the common electrode and burying of the holes. Specifically, even if the dicing is not the one completely separating chips, a dicing blade is inserted up to a position where the semiconductor substrate 1 is separated into chips (a position reaching the oxide film 4). Thereafter, the attached supporting plate 3 can be removed by mechanical polishing and dry etching. In this case, besides normal blade dicing, other methods using a laser and the like are also adoptable.

In the above-described manufacturing method, all of the steps up to the end of dicing are performed as the wafer remains to be thick. Thus, the method becomes an innovative system of producing a single-sided electrode photodiode, which has a high productivity in process and is capable of improving yields. In addition, the bias can be applied via the bumps B. Thus, not only a mere zero-bias photodiode but also a high-speed and low-noise sensor (a PIN photodiode and an avalanche photodiode) can be realized.

According to the back illuminated photodiode array of the present invention and the manufacturing method thereof, the mass production is made possible.

What is claimed is:

1. A back illuminated photodiode array in which high concentration impurity regions are formed on one plane side and the other plane side of a semiconductor substrate and the respective regions are selectively connected to anodes and cathodes of photodiodes formed on the other plane side of the semiconductor substrate, wherein the high concentration impurity regions are electrically connected to each other via holes penetrating the semiconductor substrate thereof in a thickness direction and resin is buried in the holes.

2. The back illuminated photodiode array according to claim 1, wherein the semiconductor substrate and the high concentration impurity regions are a first conductivity type, photodiodes formed on the other plane side of the semiconductor substrate include an impurity region of a second conductivity type and a semiconductor substrate, and an overall impurity semiconductor layer of the first conductivity type, which is shallower than the high concentration impurity regions, is provided on an overall plane of the one plane side of the semiconductor substrate.

* * * * *